US006493846B1

(12) United States Patent
Kondo et al.

(10) Patent No.: US 6,493,846 B1
(45) Date of Patent: Dec. 10, 2002

(54) SIGNAL PROCESSING APPARATUS AND METHOD, AND DATA RECORDING/REPRODUCING APPARATUS USING THE SAME

(75) Inventors: Masaharu Kondo, Odawara (JP); Seiichi Mita, Kanagawa-ken (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/323,703

(22) Filed: Jun. 1, 1999

(30) Foreign Application Priority Data

Jun. 3, 1998 (JP) .......................... 10-154178
Apr. 27, 1999 (JP) .......................... 11-119191

(51) Int. Cl.[7] .......................................... H03M 13/03
(52) U.S. Cl. .................... 714/794; 341/59; 341/94; 375/341
(58) Field of Search .................. 369/47.35, 59.2; 360/46, 51; 714/794, 758, 784, 795, 755, 796, 792, 788; 341/59, 94; 375/341, 148

(56) References Cited

U.S. PATENT DOCUMENTS

| 5,134,635 A | * | 7/1992 | Hong et al. ............... 375/341 |
| 5,442,646 A | * | 8/1995 | Chadwick et al. .......... 714/795 |
| 5,675,565 A | * | 10/1997 | Taguchi et al. ............... 369/59 |
| 5,809,060 A | * | 9/1998 | Cafarella et al. .......... 375/206 |
| 6,029,264 A | * | 2/2000 | Kobayashi et al. ......... 714/755 |
| 6,148,431 A | * | 11/2000 | Lee et al. .................. 375/341 |

OTHER PUBLICATIONS

NN9403175 (Method For DC Suppression without Violating the Run–Length Constraints; IBM Technical Disclosure Bulletin, Mar. 1994, US; vol. No.: 37, Issue No.: 3, Page No.: 175–178).*

* cited by examiner

Primary Examiner—Albert Decady
Assistant Examiner—Guy Lamarre
(74) Attorney, Agent, or Firm—Mattingly, Stanger & Malur, P.C.

(57) ABSTRACT

A signal processing apparatus capable of reducing burst error generation, and a highly reliable data recording/reproducing apparatus using this signal processing apparatus. This signal processing apparatus has a simple error detection/correction circuit provided just before a modulated code demodulator, thereby correcting error of a pattern easy to occur in a maximum likelihood decoder. The simple error detection/correction circuit is an error detection/correction circuit using a linear error correction code, for example, an error correction code (CRCC) formed of a cyclic code. Thus the number of burst errors after the modulated code demodulator can be decreased.

18 Claims, 8 Drawing Sheets

| ERROR IN MAXIMUM LIKELIHOOD DECODER \ GENERATOR POLYNOMIAL | 0x4CA5 | 0x72CD | 0x77D3 |
|---|---|---|---|
| CONSECUTIVE ERROR OF LENGTH 6 | ○ | △ | △ |
| CONSECUTIVE ERROR OF LENGTH 7 | ○ | ○ | × |
| CONSECUTIVE ERROR OF LENGTH 8 | △ | ○ | ○ |
| xxxooxxx | × | ○ | ○ |

○ ... NO MISCORRECTION

△ ... EQUIVALENT TO ERROR LEFT ALONE BECAUSE MISCORRECTION IS MADE ONLY FOR REDUNDANT BITS

× ... ERROR INCREASED DUE TO MISCORRECTION

SIGNAL PROCESSING APPARATUS AND METHOD, AND DATA RECORDING/REPRODUCING APPARATUS USING THE SAME

BACKGROUND OF THE INVENTION

1. Field of the Invention

The present invention relates to a signal processing apparatus and method capable of suppressing the generation of burst error, and to a data recording/reproducing apparatus using the same.

2. Description of Related Art

The magnetic disk recorder represented as a data recording/reproducing apparatus has been more and more requested to have a capability of higher recording density, and the signal processing technology in the recording/reproducing system for supporting this request has also been developed toward the higher recording density capability.

In order to cope with the S/N ratio reduced by the intersymbol interference associated with high density recording, a partial response equalization system has been employed. For example, PRML (Partial Response with Maximum Likelihood detection) class 4 has been used to detect a signal sequence nearest to a reproduced signal by means of a known interference caused in a reproducing channel, and it is already utilized in the magnetic disk recorder.

Figure 1:
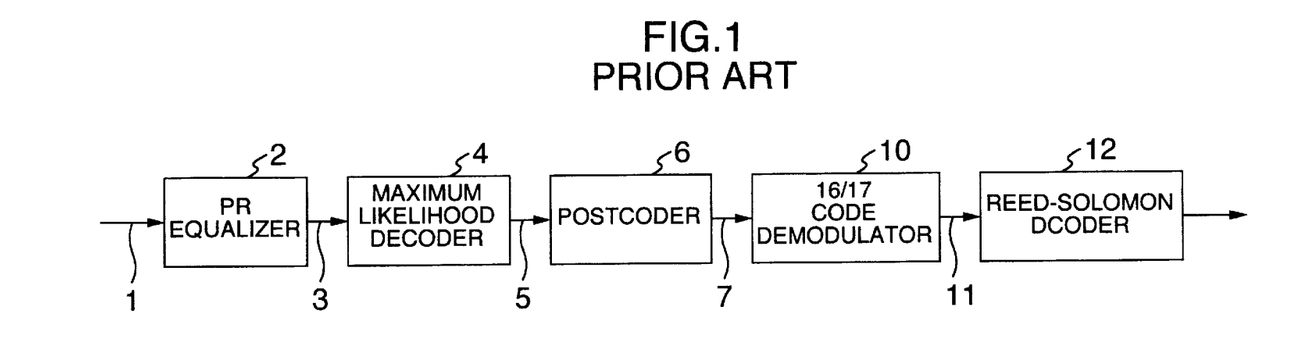
FIG. 1 is a block diagram of a conventional signal processing apparatus.

FIG. 1 shows a flow of digital information reading processing in the conventional EEPRML (Extended Extended PRML). A signal 1 read from a head is equalized by a PR equalizer 2 into a signal 3. Then a decoded data sequence 5 that was actually recorded is estimated from the signal 3 by a maximum likelihood decoder 4. The estimated coded sequence 5 is supplied through a postcoder 6 to a 16/17 code demodulator 10, where it is decoded into an information data sequence 11. The information data sequence 11 undergoes error detection and correction in a Reed-Solomon decoder 12.

The most of the error sequences in the maximum likelihood decoder 4 have a short distance from a correct sequence. The error sequences with shorter distances from the correct sequence are examined by use of an error flow graph.

Figure 2:
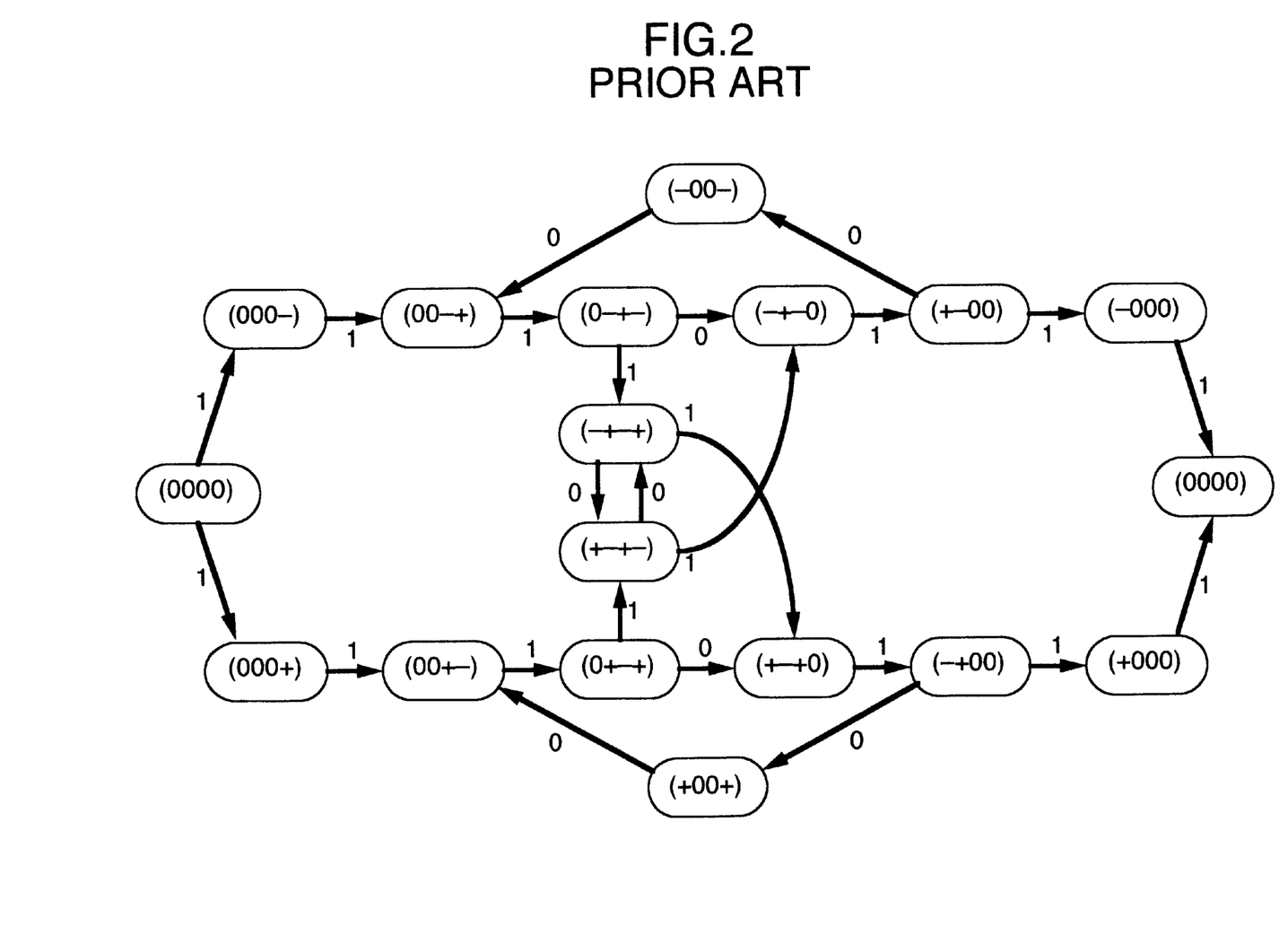
FIG. 2 is a graph showing the change of correct and error states in the maximum likelihood decoding of EEPRML.

FIG. 2 is a schematic graph of error flow within a distance of 8 from the correct sequence in EEPRML. In each state $(e_{t-3}\ e_{t-2}\ e_{t-1}\ e_t)$, $e_t$ represents error at time t. When $e_t$ is 0, the corresponding bit has no error. Similarly when $e_t$ is respectively + and −, the corresponding bits "0" and "1" have errors of "1" and "0", respectively. The numbers attached on the arrows in the flow diagram indicate the distance from the correct sequence that increase with the transition of the corresponding errors. From FIG. 2, it will be understood that the error sequences from the maximum likelihood decoder 4 in EEPRML have errors of ±(+−+) (three consecutive errors), ±(+−+− . . . ) (four or more consecutive errors), and ±(+−+00+−+) in the order of shorter distance from the correct sequence. The frequency of actual error occurrence is affected not only by the distance from the correct sequence but by the mutual correlation between the error length and noise. The actual error is likely to occur in order of errors of three consecutive bits, one bit, two bits, five bits and four bits. Where, the error of four consecutive bits "0101 . . . " is represented as "1010 . . . " or vice versa.

Also by use of more advanced PRML or by slightly moving coefficients of partial response the frequency order is somewhat changed, but error tendency is not changed.

The short errors on the modulated codes in the maximum likelihood decoder 4 are expanded into burst error by the demodulator 10. If, for example, 16/17 modulation code is used, the worst expansion is 4 bytes. This corresponds to the worst value in the case where errors occur at the final bit of 16/17 code and are propagated to the next code word by the postcoder 6. This error expansion causes the correction ability of Reed-Solomon code to be reduced.

SUMMARY OF THE INVENTION

Accordingly, it is an object of the invention to realize a signal processing apparatus and method capable of reducing burst error to a small value, and provide a highly reliable data recording/reproducing apparatus using the same.

In order to achieve the above object, a signal processing apparatus according to the invention has a simple error detection/correction circuit provided just before the modulated code demodulator. The simple error detection/correction circuit can be an error detection/correction circuit using a linear error correction code, for example, an error detection/correction circuit using an error correction code (CRCC) constructed by a cyclic code.

Moreover, data reproducing means of a data recording/reproducing apparatus is constructed by using this signal processing apparatus.

Since some error patterns, that are easy to occur in the maximum likelihood decoder, can be corrected before the modulated code demodulator by constructing the signal processing apparatus as mentioned above, the burst error after the demodulator can be reduced.

DESCRIPTION OF THE PREFERRED EMBODIMENTS

Embodiments of a signal processing apparatus and method of the invention will be described with reference to the accompanying drawings. Although the invention can be used in all digital signal transmission systems, a description will be made of data recording/reproducing apparatus, particularly a magnetic recording/reproducing apparatus using a partial response system in the following embodiments.

Figure 3:
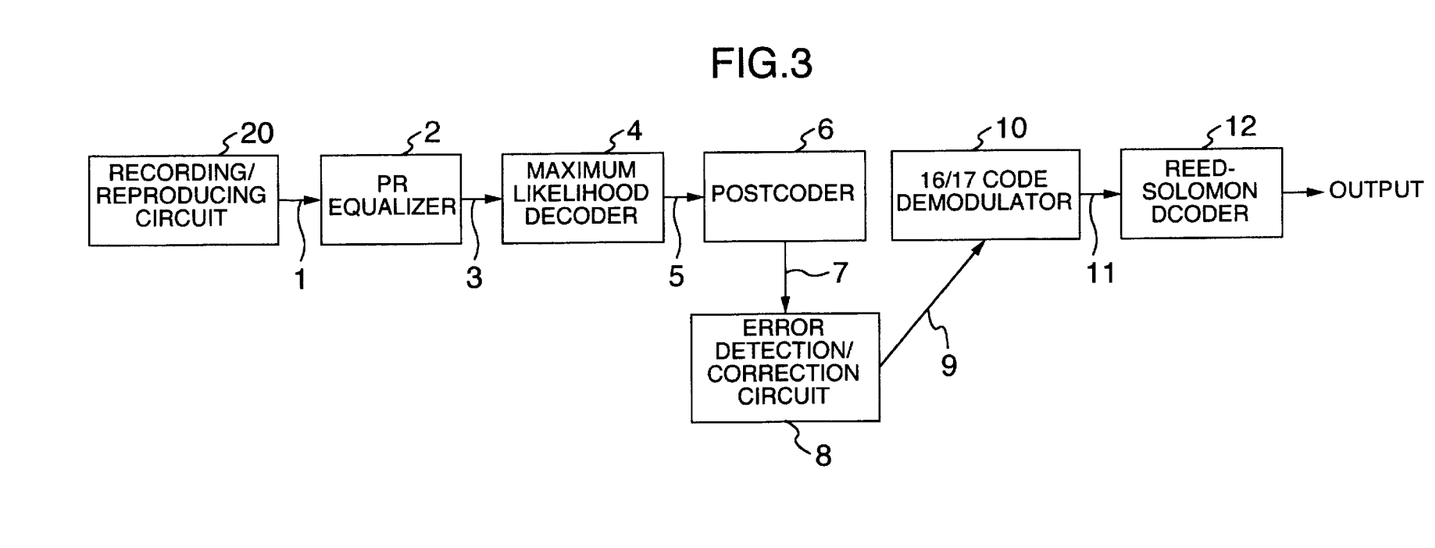
FIG. 3 is a block diagram of a signal processing apparatus concerning one embodiment of the invention.

FIG. 3 is a block diagram of a signal processing apparatus used in the reproducing system of this data recording/reproducing apparatus.

Referring to FIG. 3, a recording/reproducing circuit 20 amplifies a reproduced signal read from a recording medium by a magnetic head, and the amplified signal 1 is equalized by the PR equalizer 2.

Then, the coded data sequence that was actually recorded is estimated by the maximum likelihood decoder 4 from the signal 3 after the equalization.

The estimated coded data sequence 5, which has a transmission characteristic "1+D" in the magnetic recording/reproducing system, is further decoded to have a characteristic "$1-D^2$" by the postcoder 6 having a transmission characteristic "1−D". Here, a symbol "D" indicates one-bit delay. In this case, the transmission characteristic of the precoder in the recording system needs to be "$1/(1-D^2)$", and thus the total transmission characteristic in the recording and reproducing systems is "1". The transmission characteristic "$1-D^2$" is represented by "$1 \oplus D^2$" when expressed using a symbol "$\oplus$" that indicates addition in modulo-2 computation. This transmission characteristic can be achieved by use of a delay circuit of two bits and one addition circuit.

The coded data sequence output from the postcoder 6 is processed by an error detection/correction circuit 8 using CRCC so that a short error pattern easy to occur in the maximum likelihood decoder 4 is detected and corrected. The error detection/correction circuit 8 makes error detection and correction using a linear error correction code added in the recording system. Thus the number of burst error to be expanded by the 16/17 code demodulator 10 can be reduced by this simple error correction.

Next, the decoded data sequence 9 output from the error detection/correction circuit 8 is demodulated by the 16/17 code demodulator 10 into the information data sequence 11 associated therewith. While in this embodiment the 16/17 modulation is used as digital modulation in order to limit the run length, another digital modulation method may be utilized in the invention.

Finally, the Reed-Solomon decoder 12 detects and corrects error of the information data sequence 11.

The principle of the operation of the error detection/correction circuit 8 using CRCC will be described in detail. The error detection/correction circuit 8 makes error detection/correction using a linear error correction code as described previously.

Figure 4:
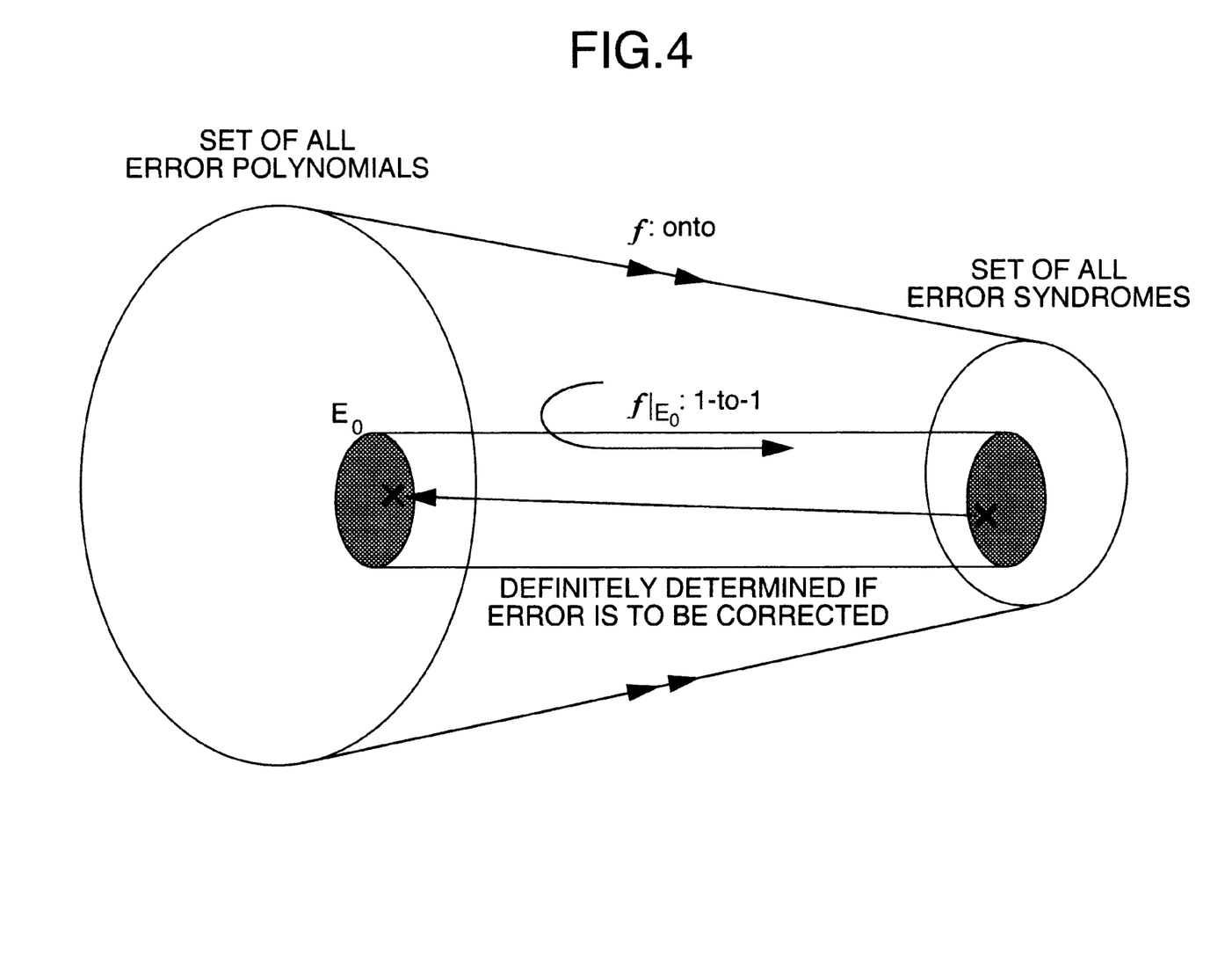
FIG. 4 is a diagram showing a conception of linear error correction used in the invention.

The linear error correction code is such an error detection code that if there is error to be corrected the error can be definitely found from the parity value (hereinafter, referred to as error syndrome). As shown in FIG. 4, if "f" represents a mapping from an error polynomial to an error syndrome, and "$E_0$" represents the set of all polynomials for errors to be corrected, then "$f|E_0$" (a mapping "f" whose domain of definition is restricted to "$E_0$") is infective, and the error polynomial included in "$E_0$" and the error syndrome have one-to-one correspondence. As the error detection code, a cyclic code can be used which makes it easy to make circuits. When the cyclic code is used, the mapping "f" corresponds to the operation for finding the remainder after dividing the error polynomial by a generator polynomial of the cyclic code. Actually, the error syndrome is calculated by, for example, an error detector 501 shown in FIG. 5.

The algorithm for error correction is performed according to a known burst error correction method using a cyclic code, that is, so-called trap decoding method. According to this method, if $x^c \equiv 1 \pmod{g(x)}$ is satisfied, or if the remainder after dividing $x^c$, where c is an integer, by the generator polynomial $g(x)$ is 1, an error pattern appears by the repetition of the operation of taking the remainder left after multiplying the error syndrome by x and dividing the product by $g(x)$. Thus $g(x)$ is necessary to have no factor of x.

The error correction code formed of a cyclic code is hereinafter called as CRCC (Cyclic Redundancy Check Code).

The structure of CRCC will be described below. Since $f|E_0$ is injective, a number q of the redundant bits of cyclic code and a number $\#E_0$ of factors in $E_0$ satisfy the following inequality:

$$2^q \geq \#E_0 \qquad (1)$$

The redundant bit number q is determined from the expression (1). In order to make q as small as possible, or to suppress a number of the error polynomials used in the error correction to a necessary minimum, it is required that CRCC be constructed so as to correct errors only when a high-frequency occurrence error occurs in one CRCC coded block or over two CRCC coded blocks.

It should be noted that the error pattern to be actually corrected is presented after the error generated in the maximum likelihood decoder 4 is passed through the postcoder 6 as illustrated in FIG. 3. In addition, when the error occurs over two CRCC coded blocks, the error pattern corresponds to a part of the generated error.

Figure 5:
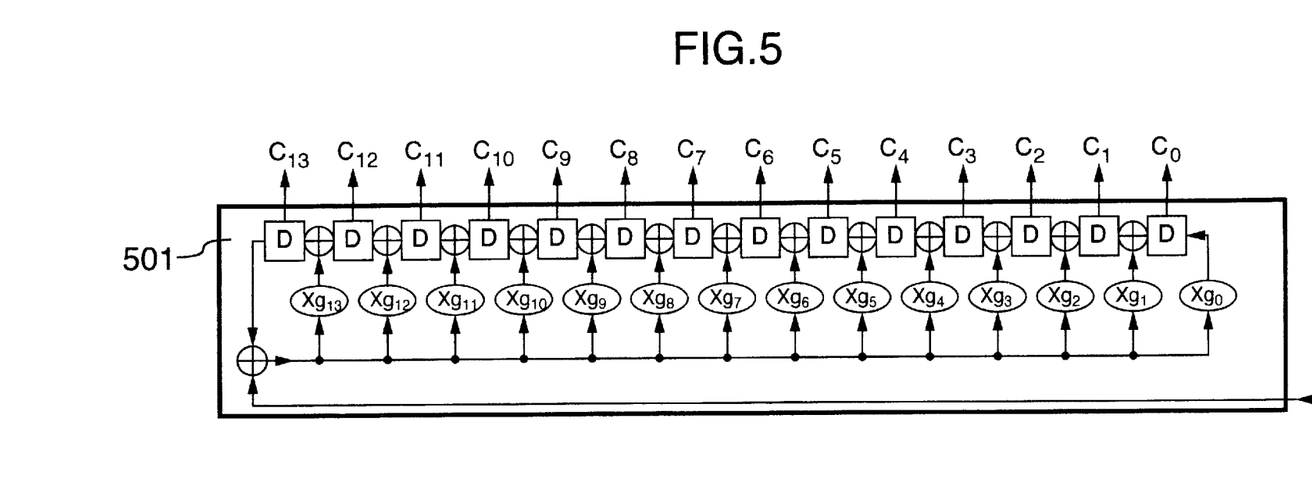
FIG. 5 is a circuit diagram showing an example of the error detector used in the invention.

However, if the error detector 501 shown in FIG. 5 simply adds calculated redundant bits of cyclic code to data blocks which are obtained by dividing a modulated and coded bit sequence at a constant length of k bits, the 0-consecutive length limited in the modulated code is excessively broken at the added portion. This is because all the redundant bits may be "0" since the redundant bits of cyclic code are the remainder.

Thus the 0-consecutive length limiting bits of p−q bits are calculated from the redundant bits corresponding to the k bits of data block where p (>q) is the number of added redundant bits. The redundant bits of cyclic code are corrected by using the 0-consecutive length limiting bits, thus leading to the limit to the 0-consecutive length. In this case, a set of the 0-consecutive length limiting bits and the redundant bits of cyclic code after being updated forms redundant bits of coded block of CRCC. The correction of the redundant bits is performed so as to meet the 0-consecutive length limitation condition and so that the sequence of data blocks of k bits with added redundant bits becomes a cyclic code word having generator polynomial $g(x)$. Even if the 0-consecutive length limiting bits lie on the more significant bit side or less significant bit side, this correction of redundant bits can be performed substantially in the same procedure.

For example, p redundant bits including 0-consecutive length limiting bits are added to each 16/17 (0, 6/6) modulated code 32 code words (k=17×32=544) to form a CRCC of a code length of 544+p, and this CRCC is combined with EEPRML. Where "0" in parentheses indicates 0-consecutive, and "6/6" in the parentheses the actual consecutive length and interleaved run length. When an error pattern is expressed, "e" represents error, and "o" no error.

The transmission characteristic of the precoder in the recording system is $1/(1 \oplus D^2)$, and the transmission characteristic of the reproducing system including the postcoder is $1 \oplus D^2$.

The 0-consecutive length limiting bits are placed on the more significant bit side of the redundant bits.

It was found that consecutive 1~5 bit errors occupy higher ranks in the occurrence frequencies of error from the maximum likelihood decoder 4 of EEPRML. Therefore, the error pattern being corrected should be a pattern of eoe, eeee, eeoee, eeooee, eeoooee after the post coder 6, and a pattern appearing when these occur across the coded blocks of CRCC. $E_0$ represents the set of all error polynomials representing the state in which one of these patterns appears in one coded block of CRCC, as expressed by the following equation:

$$E_0 = \{x^m \times (x^2+1) | m \geq 0, m+2 < 544+p\}$$

$$\cup \{1, x, x^{543+p}, x^{542+p}\}$$

$$\cup \{x^m \times (x^3+x^2+x+1) | m \geq 0, m+3 < 544+p\}$$

$$\cup \{x+1, x^2+x+1, x^{542+p}(x+1), x^{541+p}(x^2+x+1)\}$$

$$\cup \{x^m \times (x^4+x^3+x+1) | m \geq 0, m+4 < 544+p\}$$

$$\cup \{x^2+x, x^3+x^2+1, x^{541+p}(x+1), x^{540+p}$$

$$(x^3+x+1)\}$$

$$\cup \{x^m \times (x^5+x^4+x+1) | m \geq 0, m+5 < 544+p\}$$

$$\cup \{x^3+x^2, x^4+x^3+1, x^{540+p}(x+1), x^{539+p}$$

$$(x^4+x+1)\}$$

$$\cup \{x^m \times (x^6+x^5+x+1) | m \geq 0, m+6 < 544+p\}$$

$$\cup \{x^4+x^3, x^5+x^4+1, x^{539+p}(x+1), x^{538+p}$$

$$(x^5+x+1)\} \qquad (2)$$

Miscorrection may be caused when error is corrected. The miscorrection means the phenomenon in which additional error occurs at another position as a result of correction operation when an error syndrome corresponding to an error not to be corrected coincides with that corresponding to another error to be corrected.

Therefore, an error polynomial should be selected not to easily cause the erroneous correction in view of probability. Concretely, the set of all error polynomials $E_1$ is determined which is easy to occur next to $E_0$. It is assumed that the miscorrection is not likely to occur in the case where an error syndrome of an element of $E_1$ does not coincide with any one of the error syndromes of $E_0$ elements or in the case where there is little problem even if the coincidence therebetween occurs.

The maximum likelihood decoder 4 considers next easy-to-occur patterns in addition to consecutive 1~5 bit error, that is, errors of consecutive 6 bits or more as shorter length patterns of the remaining error patterns, and patterns up to eeeooeee corresponding to ±(+−+00+−+). This pattern corresponds to an error pattern having distance 8 and not included in $E_0$.

Figure 6:
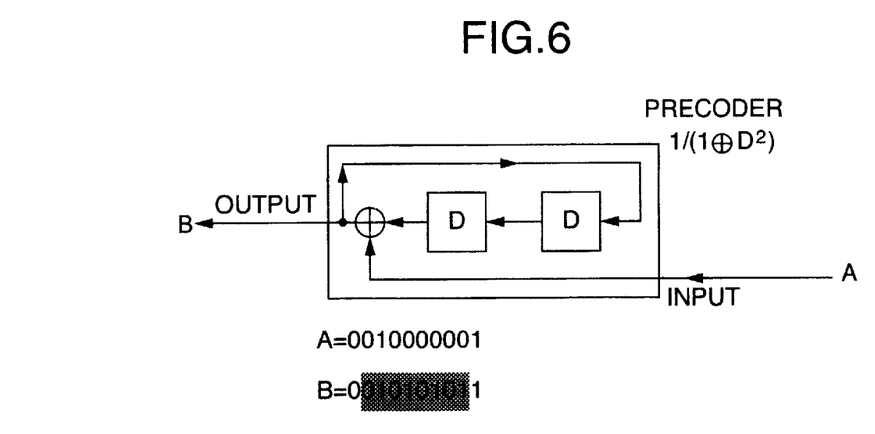
FIG. 6 is a diagram showing the condition in which error bits are expanded.

The 0-consecutive length limiting condition of the 0-consecutive length limiting bits, the redundant bits of cyclic code and other bits placed before and after those bits should be made the same (0, 6/6) as 16/17 modulated code. In this case, from FIG. 6 it will be understood that when a sequence of bits 10000001 is fed to the precoder, a consecutive error (distance 8) in a form of ±(+−+− . . . ) including the maximum error length of 8 can occur at the output. In other words, the consecutive error length supposed in $E_1$ should be considered up to the maximum length of 8.

Therefore, $E_1$ should be determined so that $E_0 \cup E_1$ includes all of (i) patterns resulting from passing consecutive error of up to a length of 8 through the post-coder 6, (ii) pattern eeoeeeeoee resulting from passing a pattern eeeooeee through the postcoder 6 and (iii) patterns appearing when those patterns (i) and (ii) is divided into plurality of coded blocks of CRCC.

The conditions of the redundant bits will be described below. Since $2^{12} < \#E_0 < 2^{13}$, it will be satisfactory if the redundant bit number p is selected to be the length 17 in the 16/17 modulated code. Thus, the code length is 561 (=17× 32+17) bits.

When p=17, the number of 0-consecutive length limiting bits s=p−q cannot be reduced to 2 or below. That is, however the polynomial of degree (17−s) is selected as a generator polynomial, there are such redundant bits of cyclic code that 0-consecutive length limiting bits cannot be taken to satisfy the 0-consecutive length limit (0, 6/6). Thus, the 0-consecutive length limiting bit number is selected to be 3, and the redundant bit number q of cyclic code to be 14.

The length of the complete cyclic code having redundant bit number of 14 is $2^{14}-1$. An example of generator polynomial is a primitive polynomial having the maximum code length. In this case, the obtained code corresponds to the length reduction of the complete cyclic code of length $2^{14}-1$ to 561 bits. Before the trap decoding method is executed, idling is necessary by omitting to check the error pattern by the number of times corresponding to the bit length of discarded error syndrome.

However, when bits are simply shifted by the number of times corresponding to the bit length which the error detector 501 discarded, delay time is increased. Thus, the error syndrome is regarded as a vector with basis $x^{13}, \ldots, x, 1$, and the vector of the error syndrome is multiplied by a fixed square matrix, thereby making the operation for the updating of the number of times corresponding to the discarded bit length. This type of operation will have an effect of preventing the delay time from being objectionable to the user unless the degree of the matrix or vector becomes so large.

Figure 7:
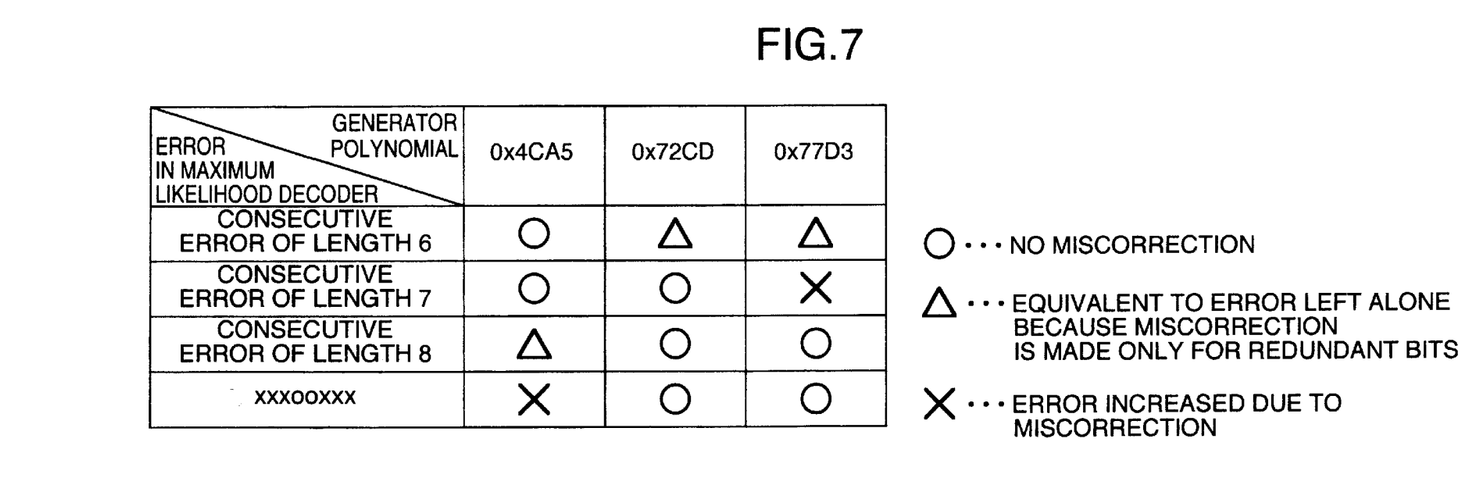
FIG. 7 is a list showing a guide for generating redundant bits in the invention.

FIG. 7 is a table showing the primitive generator polynomials of degree 14 capable of correcting errors belonging to $E_0$ that occurred in the maximum likelihood decoder 4 and causing no miscorrection under consecutive 6 bit error, and existence of miscorrection for errors belonging to $E_1$. The generator polynomial $g(x)=g_{14}x^{14}+g_{13}x^{13}+ \ldots +g_2x^2+g_1x+g_0$ ($g_i$=0 or 1, but $g_0=g_{14}=1$) is expressed in hexadecimal notation of $g_{14}2^{14}+g_{13}2^{13}+ \ldots +g_22^2+g_12+g_0$. In addition, when the increased error due to erroneous correction is included in the redundant bits of CRCC, the redundant bits are removed, thus the same result is obtained as when the errors are left alone. Therefore, this situation is not regarded as erroneous correction. From the results of FIG. 7, it will be seen that even if the error pattern in the maximum likelihood decoder 4 is an consecutive error of 8-bits or less, or eeeooeee, the generator polynomial causing no erroneous correction is only 0x (hexadecimal notation) 72CD.

Figure 8:
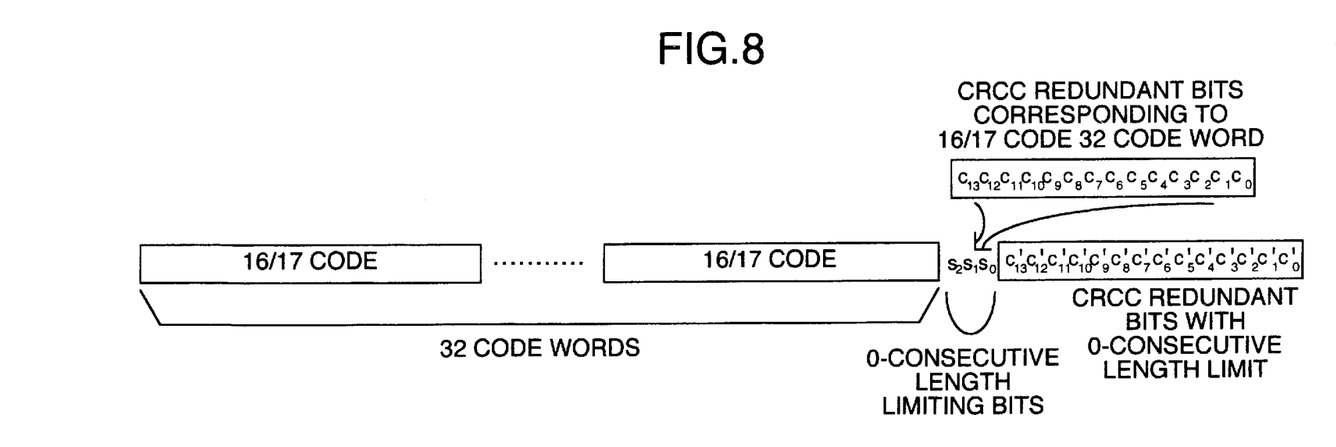
FIG. 8 is a diagram showing redundant bits suitable for use in the invention.

The following description is about one example of the computation of redundant bits of CRCC in the generator polynomial 0x72CD. FIG. 8 shows the format of redundant bits in the following description.

(a) The redundant bits of cyclic code corresponding to 16/17 code 32 code words are calculated by the error detector 501.

(b) if the redundant bits calculated at (a) are represented by $c_{13}, c_{12}, \ldots, c_2, c_1, c_0$, the 0-consecutive length limiting bits ($s_2, s_1, s_0$) are expressed by the equations (3), (4) and (5).

$$s_t 1 \quad (3)$$

$$s_t = \overline{c_{12}c_{11}}c_{10}\overline{c_5}c_4v\overline{c_{13}c_{11}}c_4v\overline{c_{13}c_{11}}c_4v\overline{c_{13}}c_{12}c_{11}c_4\overline{vc_{13}}c_{12}c_{11}\overline{c_6}c_4v\overline{c_{13}}c_{12}$$
$$\overline{c_{11}}c_6vc_{13}\overline{c_{12}c_6}vc_{13}c_{12}c_{11}\overline{c_6c_3}vc_{13}c_{12}c_6c_3vc_{13}\overline{c_{12}}c_{10}\overline{c_3}v\overline{c_{13}c_{12}c_{11}}$$
$$\overline{c_{10}}c_3vc_{13}\overline{c_{11}}c_4\overline{c_3}vc_{13}c_{12}c_{11}c_{10}c_3 c_0vc_{13}\overline{c_{12}}c_{11}\overline{c_{10}}c_6\overline{c_3}c_0vc_{13}c_{12}c_{11}c_6$$
$$\overline{c_1}vc_{13}\overline{c_{12}}c_{11}c_6c_3c_1c_0vc_{13}c_{12}c_{11}c_5c_1c_0vc_{12}c_{11}c_5c_1c_0vc_{13}c_{12}c_5v$$
$$c_{12}c_5c_4c_1c_0 \quad (4)$$

$$s_0 = \overline{c_{12}c_{11}}c_{10}\overline{c_6c_3c_0}vc_{13}c_{12}\overline{c_{11}c_{10}}c_3c_0vc_{13}c_{12}c_{11}\overline{c_{10}}c_3vc_{13}\overline{c_{12}c_{11}}c_{10}$$
$$\overline{c_3}vc_{13}c_{12}c_{11}c_{10}c_3v\overline{c_{13}c_{12}}c_{11}c_6\overline{c_3}vc_{13}c_{12}c_{11}\overline{c_{10}c_3}vc_{13}\overline{c_{11}}c_6vc_{13}c_{11}c_6$$
$$\overline{c_1}vc_{13}\overline{c_{12}}c_{11}c_6c_1c_0vc_{13}c_{11}c_4\overline{vc_{13}}c_{11}c_4vc_{13}c_{11}c_4c_3vc_{13}c_{12}c_{11}c_4v$$
$$c_{13}c_{12}c_{11}c_{10}c_5 \ vc_{13}c_{12}c_{11}c_{10}c_5 \quad (5)$$

where the upper lines indicate the inversion of "0" and "1" and v the logic sum (OR).

(c) The 0-consecutive length limiting bits ($s_2$, $s_1$, $s_0$) are fed to the input of the error detector in the order of $s_2$, $s_1$, $s_0$, and the detector calculates the remaining redundant bits $c_{13}, c_{12}, \ldots, c_2, c_1, c_0$ to be added after the 0-consecutive length limiting bits.

It can be confirmed that the 0-consecutive length limiting bits satisfy the 0-consecutive length limitation of (0, 6/6) before and after the redundant bits of CRCC.

If the equations (3), (4) and (5) are properly rearranged, and $(s_2 x^2 + s_1 x + s_0)g(x)$ is added to $c_{13}, c_{12}, \ldots, c_2, c_1, c_0$, the 0-consecutive length limiting bits can be placed on the less significant bit side of the redundant bits.

Figure 9:
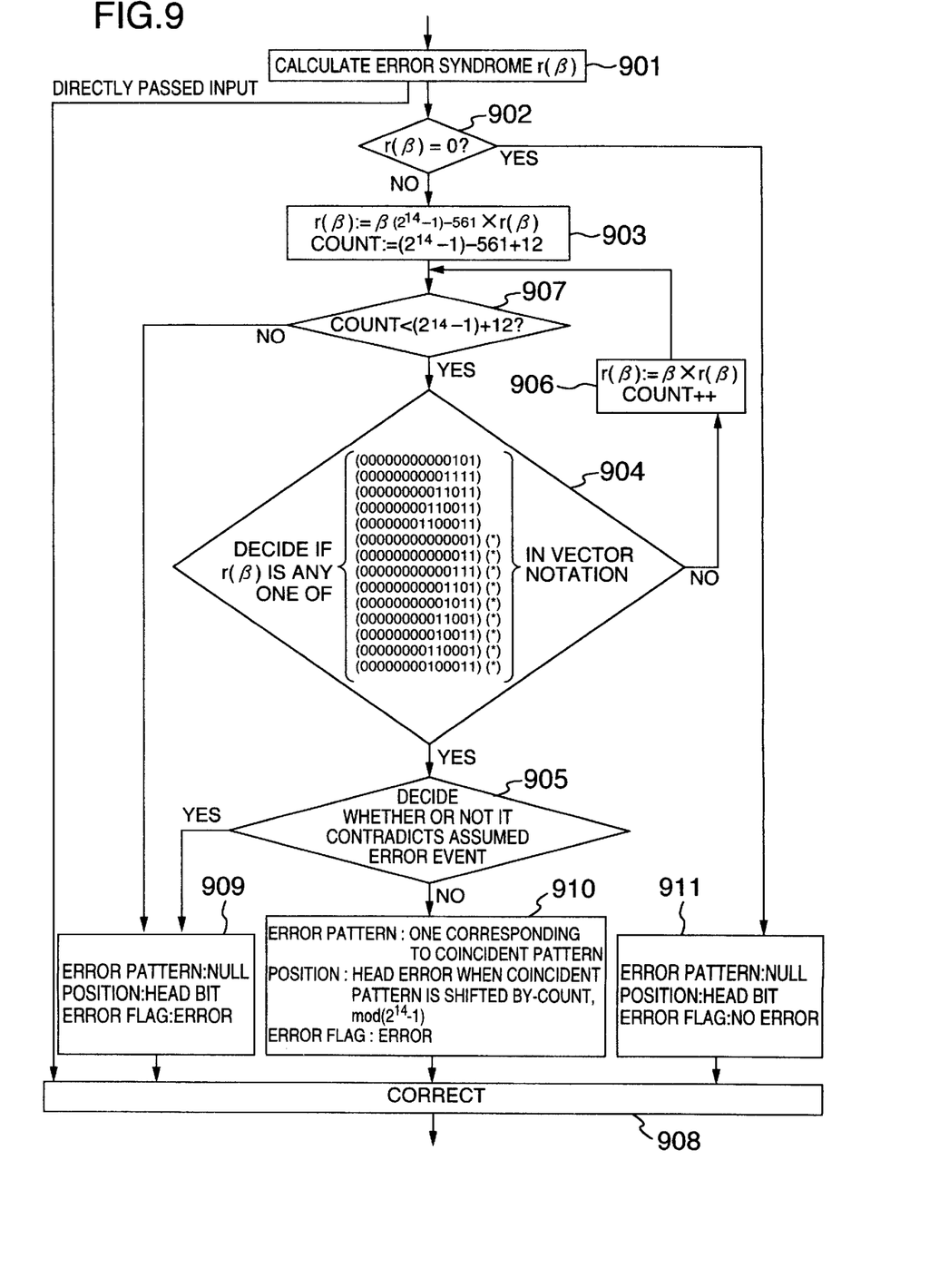
FIG. 9 is a flowchart showing algorithm for error checking and correction by CRCC in the invention.

The correction algorithm in CRCC constructed as above will be described with reference to FIG. 9. In the computation of polynomial, since "mod g(x)" is too long, and g(x) is a primitive polynomial, the coset of $F_2[x]$ (the set of all polynomials having an element of a field consisting of 0 and 1 as coefficients and x as indeterminate element) by g(x) is regarded as an element of Galois field, and the indeterminate element x of the remainder is represented by β. The operation of multiplying an error syndrome by β corresponds to shifting of error syndrome by supplying bit "0" to the input of error detector 501. The numbers attached to "Step" in the following description correspond to those shown in FIG. 9.

Step 901: Calculating error syndrome r(β) in the coded block 561 bits of CRCC by the error detector 501.

Step 902: Detecting errors. If r(β)=0, no error is assumed, and then at step 911 the correct information is set.

Step 903: Idling process. r(β) is multiplied by constant $\beta^{(16384-1)-(561-14)}$, thus updated, where $16384=2^{14}$. This operation can be expressed by a matrix acting on a vector space with $(\beta^{13}, \ldots, \beta, 1)$ as a base. There is no need to multiply $(2^{14}-1)-(561-14)$ times by β.

Step 904: Deciding whether r(β) takes any one of patterns being corrected on the basis of vector value with $\beta^{13} \ldots \beta$, 1 as basis. If the decision is yes, the error event is determined by r(β), and error position by the number of times of shifting r(β) (Step 910). In this case, since error pattern and error position are found, error can be corrected.

Step 905: Deciding whether the correction is possible (Step 910) or impossible (Step 909) on the basis of the matching with error position, because error events (attached with *) occurring over two code words are positioned at around the most significant bit or least significant bit of the coded block.

Step 906: Multiplying r(β) by β to shift r(β) when r(β) is not a value corresponding to the error pattern being corrected.

Step 907: Deciding whether the number of times of shifting is larger than 561. If it is larger than that, since error other than the error to be corrected occurs, the program goes to Step 909 where correct information is et.

Step 908: Correcting error if possible. Then, the redundant bits of CRCC are removed.

Figure 10:
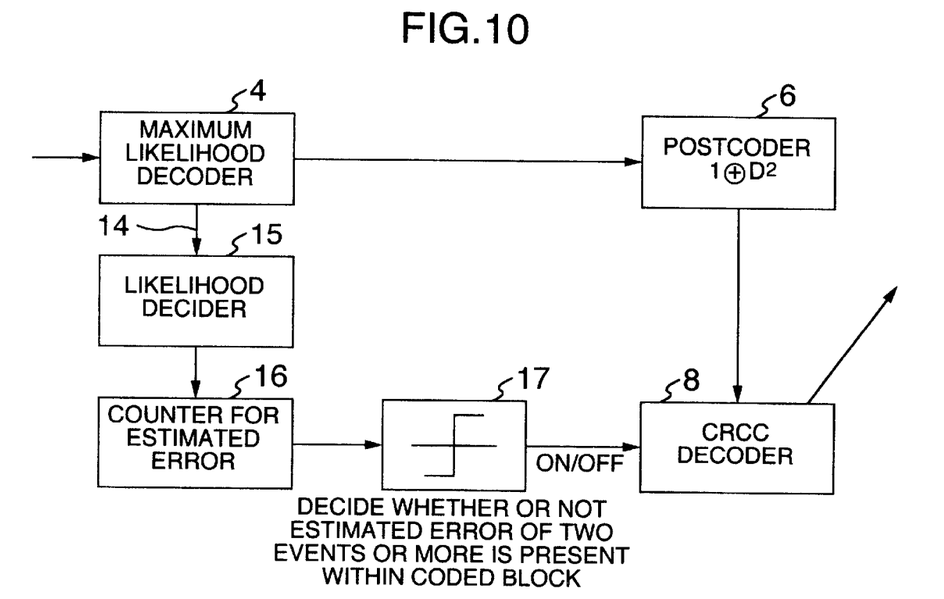
FIG. 10 is a block diagram showing an arrangement for suppressing two event error correction.

In this embodiment, the error to be corrected is one event within the coded block. The error of two events occurring within the coded block has something to cause erroneous correction. FIG. 10 is a block diagram of one example of the arrangement for suppressing the erroneous correction due to two-event error. A likelihood information 14 obtained from the maximum likelihood decoder 4 is supplied to a likelihood decider 15, which then estimates occurrence of error events. When the likelihood decider 15 decides that an error event has occurred, the content of a counter 16 is incremented by one. A threshold discriminator 17 determines whether or not two or more error events occur within the coded block, and selects the operation of a CRCC decoder 8 on/off on the basis of the decided result.

An embodiment of a signal processing apparatus and method used in the recording system of the data recording/reproducing apparatus will be described with reference to the related drawings.

Figure 11:
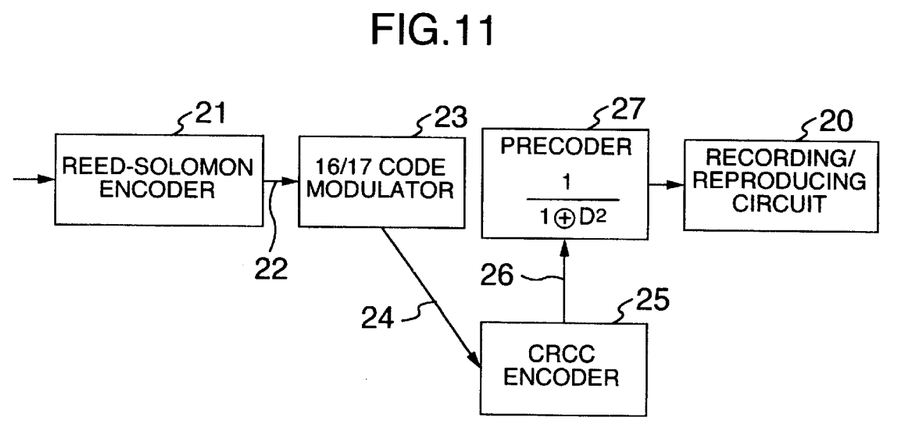
FIG. 11 is a block diagram of a signal processing apparatus concerning another embodiment of the invention.

FIG. 11 is a block diagram of the signal processing apparatus used in the recording system.

First, a Reed-Solomon encoder 21 continuously generates data blocks from the input information data sequence, and adds a Reed-Solomon error correction code to each data block.

Then, a 16/17 code modulator 23 modulates the data produced from the encoder 21 to produce a coded data sequence associated therewith. While in this embodiment 16/17 modulation is used as digital modulation in order to limit the run length, other digital modulation methods may be employed in the present invention.

In addition, a CRCC encoder 25 adds redundant bits to the coded data sequence output from the 16/17 code modulator 23. It is desired that the redundant bits include at least one limit bit for limiting the run length of the same sign, and at least one cyclic coded bit for the coded data sequence and at least one limit bit. Here, the redundant bits may include the above at least one limit bit on the more significant bit side and the above at least one cyclic coded bit on the less significant bit side. Alternatively, the redundant bits may include the above at least one cyclic coded bit on the more significant bit side and the above at least one limit bit on the less significant bit side. When 16/17 modulation is used as digital modulation, it is necessary to provide three bits for limit bits and 14 bits for cyclic coded bits.

Since the transmission characteristic of the reproducing system is "$1 \oplus D^2$" as the total transmission characteristic of the recording and reproducing system and the postcoder, a precoder 27 having a transmission characteristic of "$1/(1 \oplus D^2)$" precodes the coded data sequence produced from the CRCC encoder 25.

The output data from the precoder 27 is supplied to a recording/reproducing circuit 20, where it is processed into a suitable form as a recording signal. The recording signal is recorded by magnetic heads on a recording medium.

An embodiment of the data recording/reproducing apparatus of the invention will be described with reference to related drawings.

Figure 12:
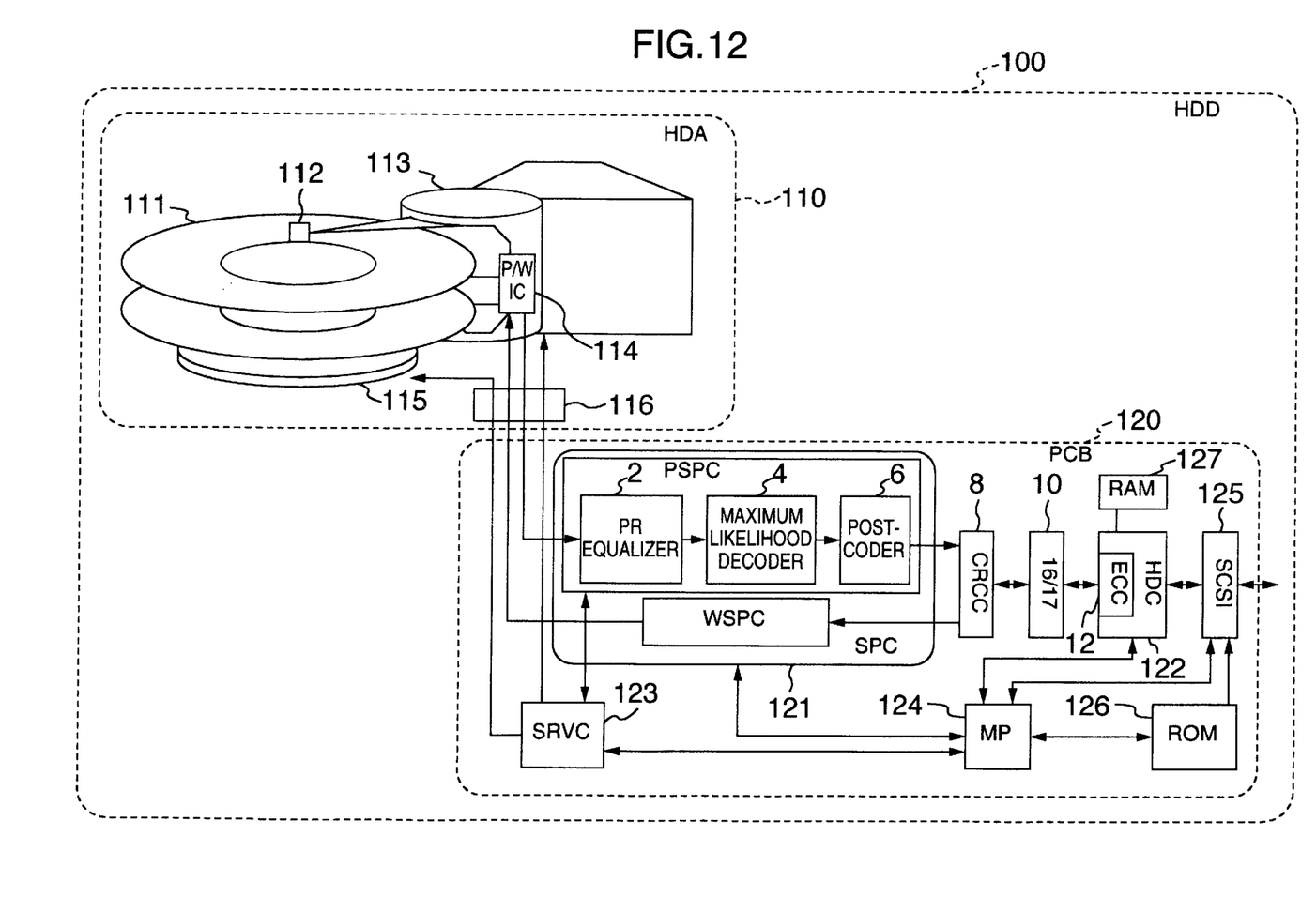
FIG. 12 is a diagram of a data recording/reproducing apparatus concerning one embodiment of the invention.

FIG. 12 shows an example of hard disk drive (HDD) to which the present invention is applied. Referring to FIG. 12, an HDD 100 has chiefly a head disk assembly (HDA) 110 including magnetic disks 111, magnetic heads 112, a carriage 113, R/W ICs 114 mounted on the carriage, a spindle motor 115 and a flexible print cable (FPC) 116, and a printed circuit board (PCB) 120 including a signal processing circuit (SPC) LSI 121, a hard disk controller chip (HDC) 122, a servo controller (SRVC) 123, a micro-processor (MP) 124, an SCSI (Small Computer System Interface) chip 125, a ROM 126 and a RAM 127. The CRCC 8 that makes coding and correction for short error correction is provided between the SPC 121 and HDC 122.

According to the invention, as described above, since the error caused at a high frequency by the maximum likelihood decoder 4 can be corrected by use of a simple CRCC just before the modulated code modulator 10 and without breaking the 0-consecutive length limitation due to the modulated code, the reliability of the recording channel can be improved.

What is claimed is:

1. A signal processing apparatus comprising:
    a maximum likelihood decoder for estimating a correct coded data sequence on the basis of an input signal obtained from a digital signal transmission system for transmitting a coded data sequence;
    a first error detection/correction circuit for detecting and correcting any one of a plurality of predetermined error patterns generated in an estimation operation of said maximum likelihood decoder, by checking a bit pattern of an error syndrome found as a result of said detection;
    a code demodulator for demodulating the coded data sequence output from said first error detection/correction circuit to obtain an information data sequence; and
    a second error detection/correction circuit for detecting and correcting an error in the information data sequence output from said code demodulator.

2. A signal processing apparatus according to claim 1, wherein said coded data sequence is precoded for partial response, and said signal processing apparatus further comprising:
    a postcoder for postcoding the coded data sequence output from said maximum likelihood decoder for a purpose of the partial response.

3. A signal processing apparatus according to claim 1, wherein said first error detection/correction circuit detects and corrects the predetermined error pattern by use of the error syndrome for at least one cyclic coded bit.

4. A signal processing apparatus according to claim 1, wherein said first error detection/correction circuit detects an error event occurrence by use of likelihood information obtained from said maximum likelihood decoder, and selects to leave an error alone or to correct an error depending on whether or not a number of error events detected for each coded block is two or more.

5. A signal processing apparatus comprising:
    a first error correction encoder for receiving an information data sequence, dividing said received information data sequence into data blocks, and adding error correction codes to said data blocks;
    a digital modulation circuit for digitally modulating said data blocks output from said first error correction encoder so as to limit a run length of the same sign, thus generating a first number of data bits; and
    a second error correction encoder for adding a second number of redundant bits to said first number of data bits to successively generate coded data blocks and outputting them as a coded data sequence;
    wherein said second number of redundant bits include at least one limit bit for limiting a run length of the same sign and at least one cyclic coded bit for said first number of data bits and said at least one limit bit.

6. A signal processing apparatus according to claim 5, further comprising:
    a precoder for precoding the coded data sequence output from said second error correction encoder for a purpose of partial response.

7. A signal processing apparatus according to claim 5, wherein said second number of redundant bits include said at least one limit bit on a more significant bit side and said at least one cyclic coded bit on a less significant bit side.

8. A signal processing apparatus according to claim 5, wherein said second number of redundant bits include said at least one cyclic coded bit on a more significant bit side and said at least one limit bit on a less significant bit side.

9. A data recording/reproducing apparatus comprising:
    a first error correction encoder for receiving an information data sequence, dividing said received information data sequence into data blocks, and adding error correction codes to said data blocks;
    a digital modulation circuit for digitally modulating said data blocks output from said first error correction encoder so as to limit a run length of the same sign, thus generating a first number of data bits;
    a second error correction encoder for adding a second number of redundant bits to said first number of data bits to successively generate coded data blocks and outputting them as a coded data sequence;
    recording/reproducing means for recording a signal on a recording medium on the basis of said coded data sequence, and reproducing the signal from said recording medium;
    a maximum likelihood decoder for estimating a correct coded data sequence on the basis of said reproduced signal;
    a first error detection/correction circuit for detecting and correcting a predetermined error pattern of a plurality of error patterns generated in an estimation operation of said maximum likelihood decoder;
    a code demodulator for demodulating the coded data sequence output from said first error detection/correction circuit to obtain an information data sequence; and
    a second error detection/correction circuit for detecting and correcting an error in the information data sequence output from said code demodulator;
    wherein said second number of redundant bits include at least one limit bit for limiting a run length of the same sign and at least one cyclic coded bit for said first number of data bits and said at least one limit bit.

10. A data recording/reproducing apparatus according to claim 9, further comprising:
    a precoder for preceding the coded data sequence output from said second error correction encoder for a purpose of partial response; and
    a postcoder for postcoding the coded data sequence output from said maximum likelihood decoder for a purpose of the partial response.

11. A signal processing method comprising the steps of:
    (a) estimating a correct coded data sequence on the basis of an input signal obtained from a digital signal transmission system for transmitting a coded data sequence;
    (b) detecting and correcting any one of a plurality of predetermined error patterns generated in an estimation operation at step (a) by checking a bit pattern of an error syndrome found as a result of said detection;
    (c) demodulating the coded data sequence corrected at step (b) to obtain an information data sequence; and
    (d) detecting and correcting an error in the information data sequence obtained at step (c).

12. A signal processing method according to claim 11, wherein said coded data sequence is precoded for partial response, and said method further comprising the step of:

postcoding the coded data sequence estimated at step (a) for a purpose of the partial response.

13. A signal processing method according to claim 11, wherein step (b) includes detecting and correcting the predetermined error pattern by use of the error syndrome for at least one cyclic coded bit.

14. A signal processing method according to claim 11, wherein step (b) includes detecting an error event occurrence by use of likelihood information obtained at step (a), and selecting to leave an error alone or to correct an error depending on whether or not a number of error events detected for each coded block is two or more.

15. A signal processing method comprising the step s of:

(a) receiving an information data sequence, dividing said received information data sequence into data blocks, and adding error correction codes to said data blocks;

(b) digitally modulating said data blocks output at step (a) so as to limit a run length of the same sign, thus generating a first number of data bits; and (c) adding a second number of redundant bits to said first number of data bits to successively generate coded data blocks and outputting them as a coded data sequence;

wherein said second number of redundant bits include at least one limit bit for limiting a run length of the same sign and at least one cyclic coded bit for said first number of data bits and said at least one limit bit.

16. A signal processing method according to claim 15, further comprising the step of:

precoding the coded data sequence output at step (c) for a purpose of partial response.

17. A signal processing method according to claim 15, wherein said second number of redundant bits include said at least one limit bit on a more significant bit side and said at least one cyclic coded bit on a less significant bit side.

18. A signal processing method according to claim 15, wherein said second number of redundant bits include said at least one cyclic coded bit on a more significant bit side and said at least one limit bit on a less significant bit side.

* * * * *